United States Patent
Chang et al.

(10) Patent No.: US 7,129,164 B2
(45) Date of Patent: Oct. 31, 2006

(54) METHOD FOR FORMING A MULTI-LAYER LOW-K DUAL DAMASCENE

(75) Inventors: Hui Lin Chang, Hsin-Chu (TW); Yung Cheng Lu, Taipei (TW); Li Ping Li, Hsinchu (TW); Tien I Bao, HsinChu (TW); Chih Hsien Lin, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/968,199

(22) Filed: Oct. 18, 2004

(65) Prior Publication Data

US 2006/0084279 A1    Apr. 20, 2006

(51) Int. Cl.
*H01L 21/4763*    (2006.01)

(52) U.S. Cl. .............. 438/637; 438/778; 438/641; 257/E21.579

(58) Field of Classification Search .......... 438/637; 257/E21.579
See application file for complete search history.

(56) References Cited

U.S. PATENT DOCUMENTS

| | | | | |
|---|---|---|---|---|
| 5,314,724 A | * | 5/1994 | Tsukune et al. | 427/489 |
| 5,895,250 A | * | 4/1999 | Wu | 438/396 |
| 6,174,796 B1 | * | 1/2001 | Takagi et al. | 438/622 |
| 6,277,758 B1 | * | 8/2001 | Ko | 438/706 |
| 6,663,787 B1 | * | 12/2003 | You et al. | 216/18 |
| 6,762,127 B1 | * | 7/2004 | Boiteux et al. | 438/702 |
| 6,893,956 B1 | * | 5/2005 | Ruelke et al. | 438/627 |
| 2005/0070128 A1 | * | 3/2005 | Xia et al. | 438/789 |

* cited by examiner

*Primary Examiner*—Thao P. Le
(74) *Attorney, Agent, or Firm*—Tung & Associates

(57) ABSTRACT

A damascene structure and method for forming the same in a multi-density dielectric insulating layer the method including providing a substrate; forming at least a first layer comprising silicon oxide according to a first process having a first density; forming at least a second layer comprising silicon oxide according to a second process over the first layer having a second density less than the first density; etching a damascene opening through a thickness portion of the at least a first and the at least a second layer; and, filling the damascene opening to form a metal filled damascene.

35 Claims, 2 Drawing Sheets

METHOD FOR FORMING A MULTI-LAYER LOW-K DUAL DAMASCENE

FIELD OF THE INVENTION

This invention generally relates to semiconductor device manufacturing methods and more particularly to a method for forming damascenes within a porous low-K IMD layer having multiple layers with decreasing density in an upper portion of the IMD layer.

BACKGROUND OF THE INVENTION

In forming damascene structures in integrated, circuit manufacturing processes, the surface condition of the damascene opening is critical for achieving acceptable adhesion and coverage of overlying layers. The damascene opening, for example a dual damascene opening is formed in an inter-metal dielectric insulating layer in a series of photolithographic patterning and etching processes, followed by formation of a barrier layer and a metal filling process.

Increasingly, low-K layers are required to reduce signal delay and power loss effects as integrated circuit devices are scaled down. One way this has been accomplished has been to introduce porosity or dopants into the dielectric insulating layer, also referred to as an inter-metal dielectric (IMD) layer.

As a result, the need for lower dielectric constant materials has resulted in the development of several different types of organic and inorganic low-k materials. In particular, incorporation of low-k materials with dielectric constants less than about 3.0 has become standard practice as semiconductor feature sizes have diminished to less than 0.2 microns. As feature sizes decrease below 0.2 microns, for example to 0.13 microns and below, materials with dielectric constants less than about 2.5 will be required. Several different organic and inorganic low-k materials have been developed and proposed for use in semiconductor devices as insulating material having dielectric constants less than about 3.0.

For example, porous silicon oxide based materials are formed by including a carbon based moiety which forms an Si—O—C type structure which then forms a porous structure following deposition and curing or treatment processes, In prior art processes the entire IMD layer has been deposited in a single step process where the entire IMD layer has about the same density or porosity volume throughout the IMD layer.

One problem with using porous low-k materials has been the difficulty of adapting conventional plasma assisted etching processes to reliably and consistently etch openings in an IMD layer. For example, the selectivity including the anisotropicity of the etching process becomes more complex as more porosity is introduced into the IMD layer to achieve lower dielectric constants. As a result, etching profiles of high aspect ratio openings, for example greater than about 4 to 1, have become more difficult to control. In addition, as the IMD layer becomes less dense, the distribution of pores may increasingly vary to the extent that etching rates vary upon etching through a thickness of the IMD layer.

Another problem related to etched openings in low-K IMD layers having an increased porosity to achieve lower dielectric constants, is the presence of a relatively rough surface due to the penetration of pore openings at the surface of the etched opening. The micro-roughness at the surface adversely affects the adhesion and coverage of overlying deposited layers, for example barrier layers. As a result, thicker barrier layers, with increased series resistance are required in order to avoid forming barrier layers having pinholes which undesirably allow electromigration of metal into the IMD layer. Further the deposition of seed layers may be non-continuously formed, thereby adversely affecting electro-chemical deposition processes. The various problems are exacerbated in higher aspect ratio holes such as via portions of a dual damascene. The various problems with low-K IMD layers including an etching profile and etched opening surface condition therefore undesirably affect yield and reliable electrical operation of an IC device.

There is therefore a need in the integrated circuit manufacturing art to develop a manufacturing process whereby porous low-K dielectric layers may be formed to improve the reliability of formation of etched openings including an etching profile and surface roughness to improve integrated circuit device yield and reliability.

It is therefore among the objects of the present invention to provide a manufacturing process whereby porous low-K dielectric layers may be formed to improve the reliability of formation of etched openings including an etching profile and surface roughness to improve integrated circuit device yield and reliability, while overcoming other shortcomings of the prior art.

SUMMARY OF THE INVENTION

To achieve the foregoing and other objects, and in accordance with the purposes of the present invention, as embodied and broadly described herein, the present invention provides a damascene structure and method for forming the same in a multi-density dielectric insulating layer.

In a first embodiment, the method includes providing a substrate; forming at least a first layer comprising silicon oxide according to a first process having a first density; forming at least a second layer comprising silicon oxide according to a second process over the first layer having a second density less than the first density; etching a damascene opening through a thickness portion of the at least a first and the at least a second layer; and, filling the damascene opening to form a metal filled damascene.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the present invention is explained by reference to an exemplary dual damascene formation process, it will be appreciated that the method of the present invention applies generally to the formation of damascenes including dual damascenes whereby a multi-layer IMD layer may be formed to improve an etching profile and a surface roughness of an etched opening. Although the method of the present invention is explained with reference to formation of an exemplary copper interconnect structure (feature) such as a dual damascene, it will be appreciated that the process may be equally as well used in forming single damascene structures as well as thicker and wider structures such as bonding pads and wide trenches.

By the term damascene is meant any damascene e.g., both single and dual damascenes. Further, it will be appreciated that the metal used to fill the metal interconnect may include tungsten, aluminum, copper and alloys thereof. The method of the present invention is particularly advantageously used in the formation of copper damascene features such as vias and trench lines with linewidths/diameters less than about 0.25 microns, more preferably less than about 0.18 microns, e.g., 0.13 microns and lower. In addition, the method is particularly advantageously used with silicon oxide based low-K dielectric insulating layers having an interconnecting porous structure and having a dielectric constant of less than about 3.0 including less than about 2.5, for example from about 2.2 to about 3.0. Further, the term 'copper' will be understood to include copper and alloys thereof.

For example, in an exemplary embodiment, referring to FIGS. 1A–1E, are shown cross sectional views of a portion of a multi-level semiconductor device at stages in an integrated circuit manufacturing process.

Figure 1A:
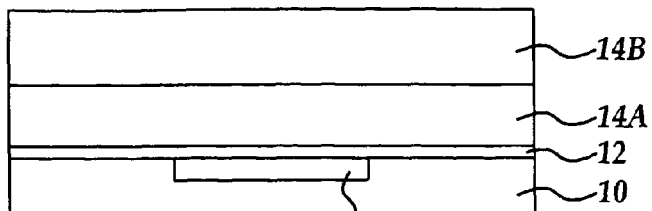
FIGS. 1A to 1E are cross sectional views of a dual damascene structure at stages of manufacture according to an embodiment of the invention.

Referring to FIG. 1A, a conductive region 11 is formed in a dielectric insulating layer 10 by conventional processes known in the micro-electronic integrated circuit manufacturing art followed by deposition of an overlying first etching stop layer 12, for example, silicon nitride (e.g., SiN, $Si_3N_4$) or silicon carbide (e.g., SiC) to a thickness of about 300 Angstroms to about 700 Angstroms by a conventional CVD, LPCVD, PECVD, or HDP-CVD process.

Still referring to FIG. 1A, formed over first etching stop layer 12 is dielectric insulating (IMD) layer portion 14A, preferably formed of a silicon oxide based low-K material having a porous structure, for example including interconnecting pores. In one embodiment, the dielectric insulating layer portions 14A and 14B are preferably formed by a PECVD process at less than about 200° C. including organo-silane precursors such methylsilanes, including tetramethylsilane and trimethylsilane.

In addition, the PECVD precursors may include organo-siloxane precursors with a ring structure such as organo-siloxanes including cyclo-tetra-siloxanes such as 1,3,5,7 tetramethylcyclotetrasiloxane, octamethylcyclotetrasiloxane, and decamethylcyclopentasiloxane. For example, IMD layer portion 14A is deposited in as deposited form, preferably including silicon hydroxide (SiOH) groups together with Si—O—Si forming precursors.

In another embodiment the IMD layer portions 14A and/or 14B are deposited by a spin-on process including precursors such as silsesquioxanes, for example hydrogen silsesquioxane (HSQ) and methyl silsesquioxane (MSQ), and organo-silanes such methylsilanes, including tetramethylsilane and trimethylsilane, as well as commercially available precursors such as SILK™ and FLARE™. It will also be appreciated that any organic or inorganic precursor that undergoes SiOH condensation reactions to form Si—O—Si covalent bonds may be used to form the as-deposited IMD layer 14A.

For example, in a spin-on process, preferably the as deposited IMD layer portion 14A has not progressed to a substantially complete cross-linking reaction to form Si—O—Si groups, for example less than about 90% of substantial completion of the cross-linking reaction, more preferably, less than about 50% of a substantially completed cross-linked reaction. By the term substantially completed cross-linking reaction is meant that greater than about 90% of cross-linking reactions to form Si—O—Si within the as deposited layer have taken place.

According to an aspect of the present invention, the as-deposited spin-on layer or PECVD layer is subjected to a controlled thermal treatment to generate chemical reactions, e.g., SiOH condensation reactions, to form Si—O—Si bonds, the chemical reactions preferably proceeding to substantial completion within the as-deposited layer. For example, the as-deposited layer of a spin-on precursor material is typically viscous (e.g., flowable at room temperature) prior to undergoing the controlled thermal treatment and substantially non-viscous (e.g., substantially non-flowable at room temperature) following the thermal treatment.

Preferred conditions for the thermal treatment include applying a temperature to the as-deposited layer within a temperature range of about 35° C. to about 400° C., more preferably a temperature range of about 100° C. to about 400° C. The thermal treatment is preferably carried out for a period of about 3 seconds to about 600 seconds, more preferably less than about 30 seconds. It will be appreciated that the precise conditions and time of the thermal treatment will depend on the particular condensation rate of the precursors at the thermal treatment temperature.

It will additionally be appreciated that heat may be applied in a variety ways including placing a substrate including the overlying as deposited film on a pre-heated heat transfer member such as a heating plate or pedestal, or ramping the heat transfer member from a lower to a higher temperature at controlled heating rates. It will be appreciated that radiative non-contacting heating methods may be suitably used to heat the as deposited film, for example using high intensity light sources, for example a rapid thermal annealing (RTA) process, as well as a conventional furnace heating process.

The thermal treatment process is preferably conducted in an inert gas environment, for example including $H_2$, $N_2$, and Ar, or mixtures thereof. Thermal treatment pressures may include atmospheric or sub-atmospheric pressures. For example, depending on the rate of gas evolution in the condensation reaction which is related to the rate of condensation (cross-linking) reactions to form covalently bonded Si—O—Si groups, the heating process may be advantageously carried out at sub-atmospheric pressures to increase the rate of gas diffusion out of the as deposited layer prior to substantial cross-linking which may trap evolved gases and lead to undesired formation of pores or voids within the as deposited layer.

According to the preferred thermal treatment method, IMD layer portions e.g., 14A and 14B are formed preferably having a decreasing density (graded density) with respect to successively deposited IMD layer portions (in an upward direction), e.g., IMD player portion 14B has a lower density compared to IMD layer portion 14A. For example, the pore volume percent at a lowermost portion of layer 14A has a volume porosity of less than about 25 vol % with respect to a selected volume, more preferably less than about 10 vol % including substantially pore-free (e.g., less than about 5 vol %). The IMD layer portion 14A is preferably formed having a thickness between about 500 Angstroms and about 6500 Angstroms. For example the IMD layer portion 14A forms about one-half or less of a dielectric layer stack thickness, for forming dual damascene structure therein. Preferably, the IMD layer portion 14A includes at least a portion of the via portion of the dual damascene structure, more preferably wherein the via portion is formed substantially within the dielectric layer 14A and an overlying trench line portion is formed substantially within the IMD layer portion 14B.

In one embodiment, the IMD layer portions are subjected to a hydrogen plasma treatment in addition to or following a thermal treatment according to preferred embodiments. In a preferred embodiment, only the uppermost IMD layer portion, e.g., 14B is subjected to a hydrogen plasma treatment. For example, a thermally treated layer e.g., IMD layer portion 14A may be formed and a subsequent hydrogen plasma treatment of overlying IMD layer portion e.g., 14B is carried out with or without a preceding thermal treatment.

For example the upper portion of the IMD layer e.g., layer 14B is preferably formed having a density between about 1.1 and about 1.5 gms/cm$^2$ with an index of refraction of between about 1.3 and about 1.4. The lower portion of the IMD layer, e.g., layer 14A is preferably formed with density greater than about 1.5 gms/cm$^2$, for example between about 1.5 and about 2.2 gms/cm$^2$, and with an index of refraction greater than about 1.4, for example between about 1.4 and about 1.6. The dielectric constant of the lower portion (e.g., via portion) of the IMD layer e.g., layer 14A is preferably between about 2.6 to about 3.2 and the upper portion (trench line portion) e.g., layer 14B is more preferably from about 2.0 to about 2.7, more preferably between about 2.2 and about 2.5.

For example, the IMD layer portions 14A and 14B may be formed by hybrid processes, for example, a spin-on process for forming the lower IMD layer portion 14A and a PECVD process for forming the overlying layer portion 14B, or vice-versa. In addition, both IMD layer portions may be formed by the same processes using the same or different precursor materials. In a preferred embodiment, the IMD layer portion is formed by a spin-on precursor, followed by a thermal treatment to achieve a relatively higher density according to preferred embodiments compared to a PECVD deposited IMD layer portion 14B, including only a hydrogen plasma treatment following deposition. IN another preferred embodiment, the lower IMD layer portion 14A is deposited by a PECVD process and only subjected to a thermal treatment, whereas the IMD layer portion 14B is deposited according to a PECVD process and is only subjected to a hydrogen plasma treatment according to preferred embodiments.

Exemplary plasma operating conditions for the hydrogen plasma treatment include primarily (H$_2$) and inert plasma source gases (e.g., having a volumetric ratio of H$_2$ to inert gas of 3:1 to 1:1). It will be appreciated that other sources of hydrogen such as NH$_3$ may be used as well. The hydrogen plasma treatment is preferably carried out at pressures preferably less than about 10 Torr, for example from about 1 Torr to about 5 Torr.

For example, in an exemplary hydrogen plasma treatment process, the hydrogen plasma treatment is carried out for a period of about 20 seconds to about 200 seconds, at an RF power of about 500 to about 3000 Watts. For example, the hydrogen plasma treatment may be advantageously carried out in-situ following PECVD deposition of the IMD layer portion e.g., layer 14B. However, separate process chambers including a controlled environment for process wafer transfer may be used to avoid exposure of the PECVD deposited layer to oxygen and water.

According to an aspect of the invention, the PECVD process for depositing the lower and/or upper IMD layer portions, 14A and 14B, is carried out using preferred precursor plasma source gases supplied using an inert carrier gas, for example where the precursor is at about carrier gas saturation, together an oxygen containing plasma source gas, for example O$_2$, O$_3$, N$_2$O, NO, CO, or CO$_2$, most preferably O$_2$. In the case both IMD layer portions e.g., IMD layer 14A and 14B are deposited by a PECVD process, preferably, the lower IMD layer portion 14A is deposited where a precursor gas volume to an oxygen-containing gas volume ratio during deposition is a lower ratio compared to deposition of the upper IMD layer portion 14B. For example, preferably, the ratio of a precursor gas volume to an oxygen-containing gas volume provided in depositing the lower IMD layer portion 14A is provided at about ½ to about ¼ of the ratio provided in depositing the upper IMD layer portion 14B in order to create a lower density upper IMD layer portion 14B.

It will be appreciated that multiple layers with decreasing density may be sequentially formed by progressively decreasing the ratio of a precursor gas volume to an oxygen-containing gas volume in the PECVD process in successive layers to form an IMD layer (stack) having a graded decreasing density (increasing volume % porosity) from a lower portion of the IMD layer to an upper portion of the IMD layer. A thermal treatment process may optionally be carried out following deposition of each IMD layer portion or following deposition of a selected number of IMD layer portions.

For example, in an exemplary embodiment, when using tetramethylsilane (TMS) as a precursor plasma gas source and O$_2$ as the oxygen containing gas source, the volumetric ratio of TMS to O$_2$ supplied during the PECVD reaction process of is preferably between about 0.3 to about 0.8 during deposition of the lower IMD layer portion 14A and about 0.8 to about 1.5 during deposition of the upper IMD layer portion 14B.

In an exemplary PECVD deposition, TMS is supplied at a flow rate of between about 100 sccm and 300 sccm and O$_2$ is supplied at a flow rate of between about 500 and 700 sccm during deposition of the lower IMD layer portion 14A whereas during the deposition of the upper IMD layer portion 14B, TMS is supplied at a flow rate of between about 300 sccm and 500 sccm and O$_2$ is supplied at a flow rate of between about 300 and 600 sccm.

Exemplary PECVD reaction conditions for both deposition of the lower and upper IMD layer portions include a substrate deposition temperature of between about 100° C. and about 200° C., an RF power of between about 200 Watts and about 500 Watts, and a pressure of about 1 Torr to about 10 Torr.

Following PECVD deposition of the lower IMD layer portion 14A, a curing process including one of a thermal treatment and/or hydrogen containing plasma treatment, more preferably at least a thermal treatment is carried out for the lower IMD layer portion 14A. The thermal and/or plasma treatment process is preferably carried out at a temperature of about 100° C. to about 400° C.

Figure 1B:
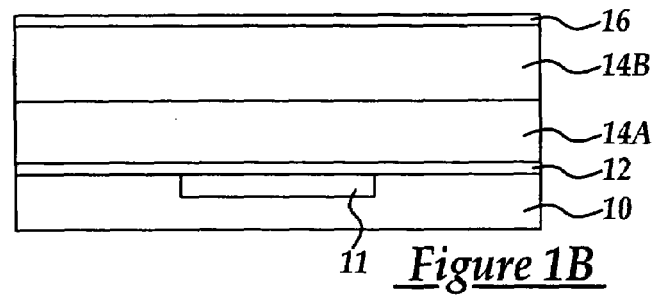

Referring to FIG. 1B, one or more hardmask/BARC layers, preferably a single inorganic layer e.g., layer 16 functioning as both a hard mask and a bottom anti-reflectance coating (BARC), for example preferably formed of silicon oxynitride, or silicon oxycarbide, is provided over the IMD layer portion 14B at an appropriate thickness, to minimize light reflectance from the IMD layer portion 14B surface in a subsequent photolithographic patterning process.

Figure 1C:
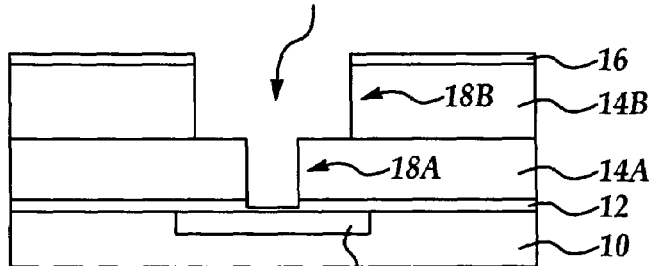

Referring to FIG. 1C, conventional lithographic and etching processes are then carried to form a dual damascene opening 18. For example a via opening 18A, is first formed by conventional photolithographic patterning and reactive ion etch (RIE) processes, preferably, but not exclusively, formed having a diameter of less than about 0.25 microns, for example about 0.18 microns or less. Following formation of the via opening portion 18A, and removal of the resist layer (not shown) a resinous filling (not shown) may optionally be deposited and etched back to fill the via opening prior to a second photolithographic patterning process to form the trench line portion 14B.

Figure 1D:
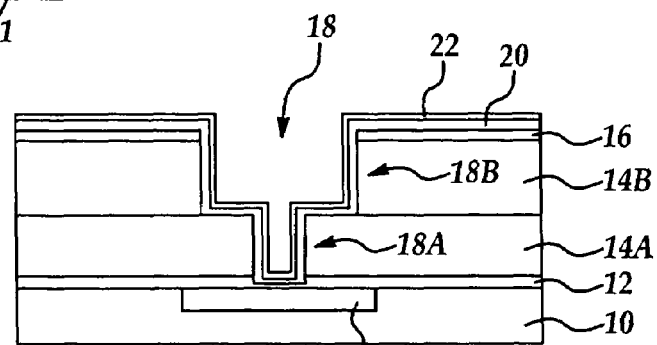

Referring to FIG. 1D, conventional processes are then carried out to deposit a barrier layer 20, preferably including one of a refractory metal, refractory metal nitride, and silicided refractory metal nitride layer, for example Ta, Ti, W, TaN, TiN, WN, TaSiN, TiSiN, and WSiN. In a preferred embodiment, for filling the dual damascene opening 18 with a copper filling, preferably the barrier layer 20 is Ta/TaN, TaN or TaSiN. The barrier layer is advantageously able to be formed to a somewhat lower thickness according to the present invention due to the relatively higher density of the lower IMD layer portion 14A including the via portion 18A. For example, the barrier layer is preferably deposited to a thickness of between about 50 Angstroms and about 350 Angstroms.

Still referring to FIG. 1D, conventional copper deposition processes, for example electro-chemical deposition preceded by deposition of a copper seed layer 22 is carried out. Advantageously, the copper seed layer is advantageously able to be formed more reliably at a lower thickness according to the present invention due to the relatively higher density of the lower IMD layer portion 14A including the via portion 18A. For example, the copper seed layer is preferably deposited to a thickness of between about 50 Angstroms and about 150 Angstroms.

Figure 1E:
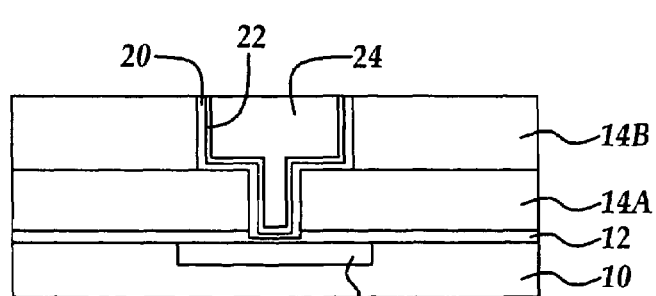

Referring to FIG. 1E, a copper ECD process is first carried out followed by a conventional CMP process to remove the excess portion of copper layer 24, barrier layer 22, and at least a portion of hardmask/BARC layer 16 to complete the formation of the dual damascene.

A method of forming a multi-density IMD layer and formation of a damascene, e.g., a dual damascene structure therein has been developed, which has been found to improve the via and trench etching profiles as well as improving coverage and adhesion of barrier layers and seed layers at relatively lower thicknesses than is typically required when an entire IMD layer is provided with a relatively uniform density. By providing the via portion of the IMD layer at a relatively higher density, while maintaining the lower density and lower dielectric constant of the trench portion of the IMD layer portion (upper portion), the benefits of increased signal speed and lower power loss are largely maintained while improving etching profiles and reliability and electrical performance issues relating to barrier layer adhesion and electrical resistance, as well as reducing defects introduced by undesirably forming a non-continuous copper seed layer in a copper electrodeposition process.

Figure 2:
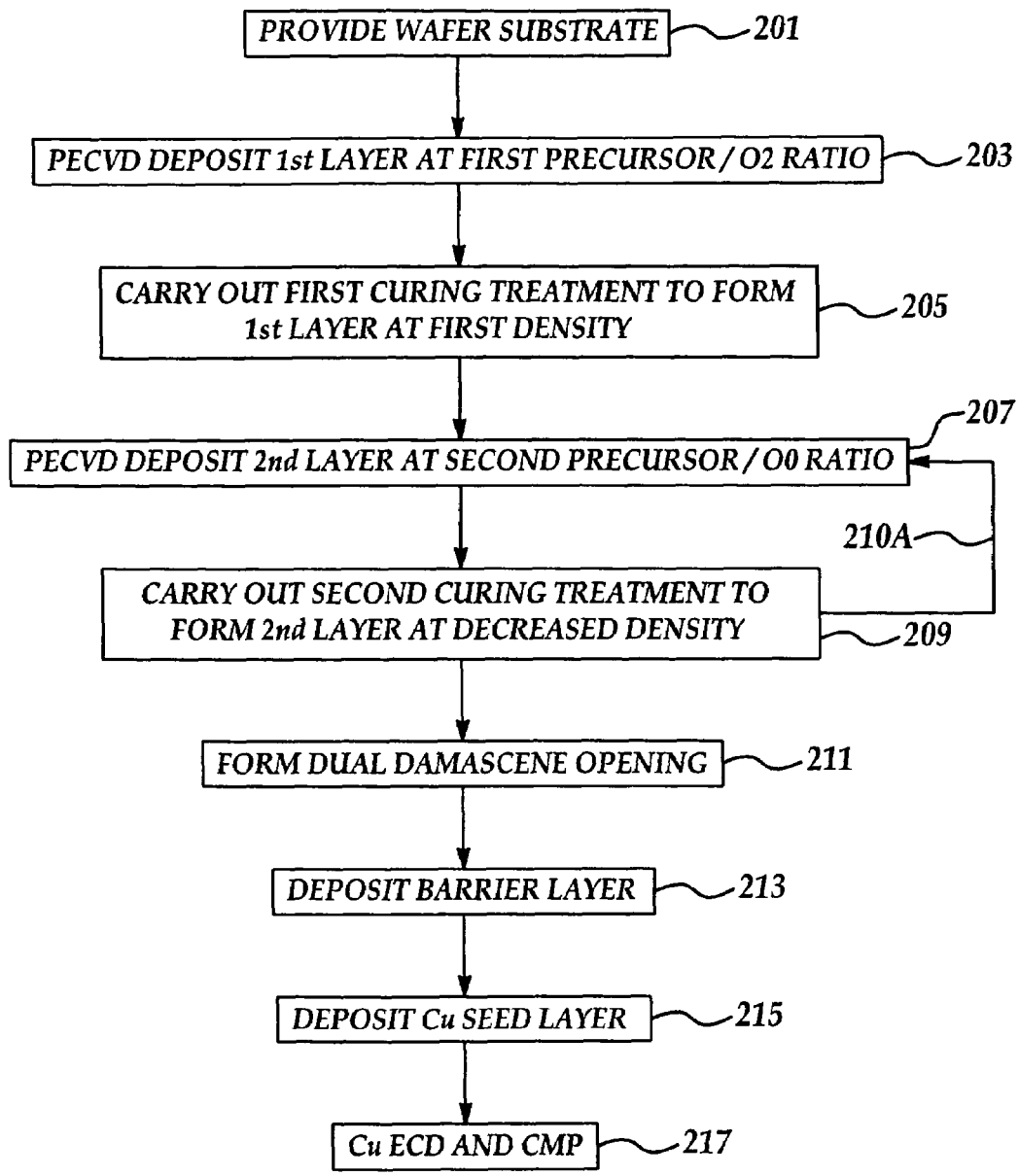
FIG. 2 is a process flow diagram including several embodiments of the present invention.

Referring to FIG. 2 is shown a process flow diagram including several embodiments of the present invention. In process 201, a semiconductor wafer process surface is provided. In process 203, a first IMD layer portion is deposited according to a first PECVD process at a first selected precursor to oxygen-containing gas volumetric ratio according to preferred embodiments. In process 205, a curing step is carried out to form a first IMD layer portion having a first density. In process 207, a second IMD layer portion is deposited according to the PECVD process over the first IMD layer portion at a higher precursor to oxygen-containing gas volumetric ratio according to preferred embodiments. In process 209, a second curing process is carried out to form a second IMD portion having a second density lower than the first IMD portion. As indicated by process directional arrow 210A, process 207 may be repeated. In process 211, a dual damascene opening is formed. In process 213, a barrier layer is blanket deposited to line the dual damascene opening according to preferred embodiments. In process 215, a copper seed layer is deposited according to preferred embodiments. In process 217 the dual damascenes completed by a copper ECD process followed by a CMP process.

The preferred embodiments, aspects, and features of the invention having been described, it will be apparent to those skilled in the art that numerous variations, modifications, and substitutions may be made without departing from the spirit of the invention as disclosed and further claimed below.

The invention claimed is:

1. A method for forming a multi-density dielectric insulating layer for forming a metal filled damascene feature therein comprising the steps of:
   providing a substrate;
   forming at least a first layer comprising silicon oxide according to a first process having a first density;
   forming at least a second layer comprising silicon oxide according to a second process over the first layer having a second density less than the first density;
   wherein the first layer is formed having a density between about 1.5 and 2.2 gms/cm$^2$ and the second layer is formed having a density of less than about 2.2 gms/cm$^2$;
   etching a damascene opening through a thickness portion of the at least a first and the at least a second layer; and,
   filling the damascene opening to form a metal filled damascene.

2. The method of claim 1, wherein the damascene opening comprises a via portion and an overlying trench line portion.

3. The method of claim 2, wherein the via portion comprises the at least a first layer and the trench line portion comprises the at least a second layer.

4. The method of claim 1, wherein the at least a first and the at least a second layer are formed by a process selected from the group consisting of spin-on, CVD, and PECVD.

5. The method of claim 1, wherein the first and second silicon oxide forming precursors are selected from the group consisting of silsesquioxanes, organo-silanes, and organo-siloxanes.

6. The method of claim 1, wherein the first and second processes comprise a PECVD process comprising an oxygen containing source gas and a precursor source gas comprising precursors selected from the group consisting of organo-silanes and organo-siloxanes.

7. The method of claim 6, wherein the oxygen containing source gas is selected from the group consisting of $O_2$, $O_3$, $N_2O$, and NO.

8. The method of claim 6, wherein the precursor source gas is selected from the group consisting of methylsilanes and methylcyclotetrasiloxanes.

9. The method of claim 6, wherein the at least a first layer is formed comprising a first relatively lower volumetric gas ratio of precursor source gas to the oxygen containing source gas compared to a respective second volumetric gas ratio for forming the least a second layer.

10. The method of claim 9, wherein the first relatively lower volumetric gas ratio is lower by about a factor of about ½ to about ¼.

11. The method of claim 1, wherein a curing process selected from the group consisting of a thermal treatment and a hydrogen containing plasma treatment is carried out following the respective depositions of the at least a first and the at least a second layer.

12. The method of claim 1, wherein the curing process for the at least a first layer consists essentially of a thermal treatment.

13. The method of claim 1, wherein the curing process for the at least a second layer consists essentially of a hydrogen containing plasma treatment.

14. A method for forming a metal filled damascene structure within a dual-density dielectric insulating layer comprising the steps of:
   providing a semiconductor process wafer comprising a process surface;
   forming a first layer comprising silicon oxide over the process surface according to a first process selected from the group consisting of spin-on and CVD;
   carrying out a first curing process selected from the group consisting of a thermal treatment and a hydrogen containing plasma treatment to form a first layer having a first density;
   forming a second layer over the first layer comprising silicon oxide according to a second process selected from the group consisting of spin-on and CVD;
   carrying out a second curing process selected from the group consisting of a thermal treatment and a hydrogen containing plasma treatment to form a second layer having a second density less than the first density wherein the first layer is formed having a density between about 1.5 and 2.2 gms/cm$^2$ and the second layer is formed having a density of less than about 2.2 gms/cm$^2$; and,
   forming a damascene opening extending through a thickness portion of the first and second layers.

15. The method of claim 14, wherein the spin-on process comprises silicon oxide forming precursors selected from the group consisting of silsesquioxanes, organo-silanes, and organo-siloxanes.

16. The method of claim 14, wherein the CVD process comprises a PECVD process comprising an oxygen containing source gas and a precursor source gas selected from the group consisting of organo-silanes and organo-siloxanes.

17. The method of claim 16, wherein the oxygen containing source gas is selected from the group consisting of $O_2$, $O_3$, $N_2O$, and NO.

18. The method of claim 16, wherein the precursor source gas is selected from the group consisting of methylsilanes and methylcyclotetrasiloxanes.

19. The method of claim 16, wherein the first layer is formed comprising a first relatively lower volumetric gas ratio of precursor source gas to the oxygen containing source gas compared to a respective second volumetric gas ratio for forming the second layer.

20. The method of claim 19, wherein the first relatively lower volumetric gas ratio is lower by about a factor of about ½ to about ¼.

21. The method of claim 14, wherein the first curing process consists essentially of a thermal treatment.

22. The method of claim 14, wherein the second curing process consists essentially of a hydrogen containing plasma treatment.

23. The method of claim 14, wherein the damascene opening is a dual damascene opening comprising a via portion formed substantially within the first layer and a trench line portion formed substantially within the second layer.

24. The method of claim 14, further comprising the steps of:
   blanket depositing a barrier layer over the damascene opening; and,
   blanket depositing over the barrier layer a metal layer selected from the group consisting of aluminum, tungsten, and copper.

25. The method of claim 24, wherein the step of blanket depositing comprises a copper electro-chemical deposition process comprising first blanket depositing a continuous copper seed layer.

26. The method of claim 1, wherein the first and second layers are formed by a respective first and second PECVD process where the first PECVD process comprises a relatively higher proportion of oxygen containing gas relative to a silicon containing precursor gas compared to the second PECVD process.

27. The method of claim 26, wherein said silicon containing precursor gas is selected from the group consisting of organo-silanes and organo-siloxanes.

28. The method of claim 16, wherein the first and second layers are formed by a respective first and second PECVD process wherein the first PECVD process comprises a relatively higher proportion of oxygen relative to a precursor gas compared to the second PECVD process.

29. The method of claim 28, wherein said silicon containing precursor gas is selected from the group consisting of organo-silanes and organo-siloxanes.

30. A method for forming a multi-density dielectric insulating layer for forming a metal filled damascene feature therein comprising the steps of:
   providing a substrate;
   forming at least a first layer comprising silicon oxide according;
   carrying out a first curing process selected from the group consisting of a thermal treatment and a hydrogen containing plasma treatment to form said at least a first layer having a first density;
   forming at least a second layer comprising silicon oxide according to a second process over the first layer;
   carrying out a second curing process selected from the group consisting of a thermal treatment and a hydrogen containing plasma treatment to form said at least a second layer having a second density less than the first density wherein the first layer is formed having a density between about 1.5 and 2.2 gms/cm$^2$ and the second layer is formed having a density of less than about 2.2 gms/cm$^2$;
   etching a dual damascene opening comprising a via portion and trench line portion through a thickness portion of the at least a first and the at least a second layer wherein the via portion comprises the at least a first layer and the trench line portion comprises the at least a second layer; and,
   filling the dual damascene opening with metal to form a metal filled dual damascene.

31. The method of claim 30, wherein the first and second process are selected from the group consisting of spin-on, CVD, and PECVD.

32. The method of claim 30, wherein the first and second layers are formed by a respective first and second PECVD process where the first PECVD process comprises a relatively higher proportion of oxygen containing gas relative to a silicon containing precursor gas compared to the second PECVD process.

33. The method of claim 32, wherein said silicon containing precursor gas is selected from the group consisting of organo-silanes and organo-siloxanes.

34. The method of claim 32, wherein the silicon containing precursor gas is selected from the group consisting of methylsilanes and methylcyclotetrasiloxanes.

35. The method of claim 30, wherein the first curing process consists essentially of a thermal process and the second curing process consists essentially of a hydrogen containing plasma treatment.

* * * * *